United States Patent
Bernstein et al.

(10) Patent No.: US 6,580,293 B1
(45) Date of Patent: Jun. 17, 2003

(54) BODY-CONTACTED AND DOUBLE GATE-CONTACTED DIFFERENTIAL LOGIC CIRCUIT AND METHOD OF OPERATION

(75) Inventors: Kerry Bernstein, Underhill, VT (US); Peter E. Cottrell, Essex Junction, VT (US); Stephen V. Kosonocky, Wilton, CT (US); David Meltzer, Wappingers Falls, NY (US); Edward J. Nowak, Essex Junction, VT (US); Kevin J. Nowka, Round Rock, TX (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,325

(22) Filed: Dec. 14, 2001

(51) Int. Cl.[7] .............................................. H03K 19/096
(52) U.S. Cl. ........................... 326/95; 326/98; 326/115; 326/127
(58) Field of Search ................................ 326/95–1, 98, 326/115, 127

(56) References Cited

U.S. PATENT DOCUMENTS 4,833,347 A * 5/1989 Rabe ............................ 30/443
6,009,021 A * 12/1999 Kioi ...................... 365/189.06
6,137,319 A * 10/2000 Krishnamurthy et al. ..... 327/51
6,388,471 B1 * 5/2002 Lu et al. ......................... 326/98

OTHER PUBLICATIONS

Cascode Voltage Switch Logic: A Differential CMOS Logic Family, by Lawrence G. Heller, William R. Griffin, James W. Davis and Nandor G. Thoma, ISSCC 84, Feb. 22, 1984, pp. 16 and 17.

* cited by examiner

Primary Examiner—Michael Tokar
Assistant Examiner—Anh Tran
(74) Attorney, Agent, or Firm—Downs Rachlin Martin PLLC

(57) ABSTRACT

A differential logic circuit (20, 120, 220, 320, 420 and 520) designed to ensure stability of the output of the circuit. The logic circuit includes a differential load structure (22, 122, 222, 322, 422) that is connected to evaluate transistors (50, 52, 54, 56). In several embodiments, the outputs of the load transistors (30, 32) in the differential load structure are connected to the bodies of the evaluate transistors. In the other embodiments, the outputs of the load transistors in the differential structure are connected to one of the gates of a double-gated evaluate transistors. Level-shifting output buffers (160, 178) are used in connection with the embodiments of the invention that do not include double-gated evaluate transistors.

22 Claims, 4 Drawing Sheets

BODY-CONTACTED AND DOUBLE GATE-CONTACTED DIFFERENTIAL LOGIC CIRCUIT AND METHOD OF OPERATION

BACKGROUND OF THE INVENTION

1. Field of the Invention

The present invention relates to differential CMOS and silicon-on-insulator (SOI) logic devices, and in particular to differential cascode voltage switch (DCVS) logic devices and domino circuit logic devices.

2. Background of the Invention

Differential CMOS and SOI logic is often used when it is desired to perform complex Boolean logic functions and circuit density is an important design concern. Potentially, DCVS and domino circuit logic is twice as dense as primitive NAND/NOR logic. In DCVS and domino circuit logic, differential pairs of MOS devices are cascaded into powerful combinational logic tree networks.

The ongoing demand for reduction in the power and "footprint" of logic devices can give rise to signal stability problems in DCVS and domino logic. To save power required to drive MOSFET gate capacitance, a natural design consideration is to reduce gate size. Unfortunately, signal stability is often compromised as MOSFET gates are reduced in size, thereby giving rise to errors in logic evaluation.

Use of SOI technology in connection with DCVS and domino circuit logic can be problematic because of junction leakage. Due to the electrically floating body of an SOI MOSFET, charge leaking across its drain-body or source-body junction diode has the ability over time of changing the potential of the body. This change gives rise to threshold voltage variation and hence delay variation. The body contact used to hold the SOI MOSFET body potential to a fixed voltage in cases where variation is intolerable also tends to reduce performance.

Low voltage operation of logic circuits can be used to reduce power in a logic circuit, but can be problematic with high or nominal threshold MOSFET transistors. The overdrive voltage required to turn on a device is given by $V_{od} = V_o - V_T$, where $V_o$ is the drive voltage of the preceding logic gate, and $V_T$ is the threshold voltage of the MOSFET. It is desirable to operate the logic transistors with a low $V_T$ to maximize the overdrive voltage $V_{od}$, resulting in higher speed operation, proportional to the overdrive voltage. A consequence of operating transistors with a low $V_T$ results in large D.C. parasitic leakage currents

BRIEF SUMMARY OF THE INVENTION

One aspect of the present invention is a logic circuit, comprising a plurality of evaluate transistors, each having a body, and a differential load structure connected to each of the bodies.

Another aspect of the present invention is a method of enhancing stability of a differential logic circuit. The method involves providing a differential logic circuit having a plurality of transistors arranged in a first evaluate tree and a second evaluate tree, each transistor having one of a single gate with a body and a double gate, and a differential load structure having a first intermediate output node and a second intermediate output node. The next step involves biasing, in the first evaluate tree, the body of each transistor when each transistor has a single gate or at least one of the double gates of each transistor when each transistor has a double gate with voltage present at the second intermediate node. Then, the next step involves biasing, in the second evaluate tree, the body of each transistor when each transistor has a single gate and the at least one of the double gates of each transistor when each transistor has a double gate with voltage present at the first intermediate node.

Yet another aspect of the present invention is a logic circuit comprising a plurality of evaluate transistors, each having first and second gates and a differential load structure connected to the first gates of the plurality of transistors.

Another aspect of the present invention is a method to automatically adjust the threshold of evaluate transistors by connection of body nodes to force the bodies of the evaluate transistors to a high level before the gate is evaluated then self-adjusting the bodies to a lower potential for evaluate trees that did not discharge after logic evaluation, increasing evaluation speed and lowering overall leakage of the function.

BRIEF DESCRIPTION OF THE SEVERAL VIEWS OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE INVENTION

The present invention is an alteration to the differential topology of static (i.e., DCVS) and dynamic (i.e., domino) logic circuits. In both cases, the circuit includes a set of evaluate transistors and a differential circuit. The transistors may be either single-gate or double-gate FETs. In the single gate, isolated body case, the bodies of the evaluate transistors are tied to the complementary side of the differential circuit. In the double-gated MOSFET case, the second gate of each evaluate transistor is tied to the complementary side of the differential circuit. While implementation of the invention in a silicon-on-insulator technology environment takes particular advantage of unique body isolation features of the SOI device, the single-gated embodiments of the invention may also be advantageously implemented in a common triple-well process.

Figure 1:
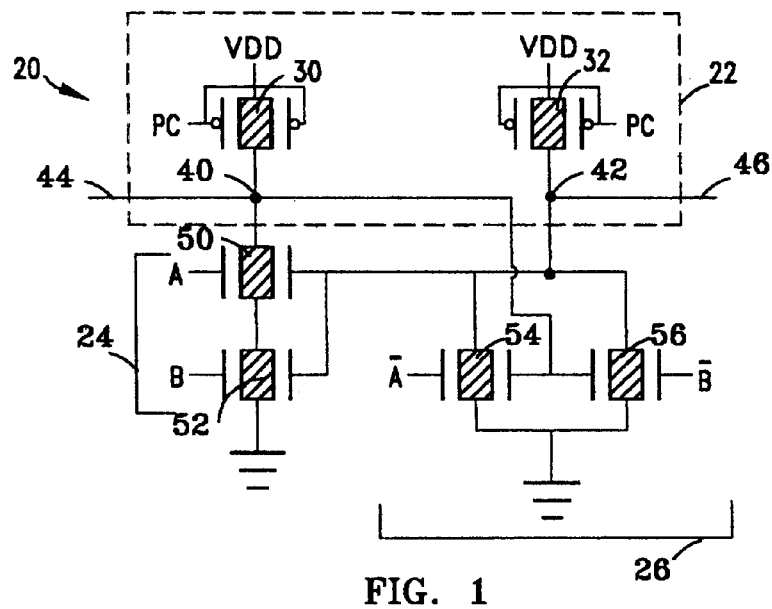
FIG. 1 is a circuit diagram of a dynamic domino logic circuit using double-gated transistors.

Referring to FIG. 1, differential logic circuit 20 is a dynamic domino circuit having a differential load structure 22, a first evaluate tree 24 and a second (complementary) evaluate tree 26. Differential load structure 22 includes a first double-gated PFET (PMOSFET) 30 and a second double-gated PFET 32, both connected to $V_{DD}$. One gate of double-gated PFETs 30 and 32 is connected to a precharge clock identified as PC. The output of PFET 30 is available at intermediate node 40 and the output of PFET 32 is available at intermediate node 42. Nodes 40 and 42, which carry the logical outputs from circuit 20, are also connected to downstream logic and/or other circuitry not forming part of circuit 20 via lines 44 and 46, respectively.

Evaluate tree 24 includes double-gated NFET (NMOSFET) 50, one gate of which is connected to logical input A, and double-gated NFET 52, one gate of which is connected to logical input B. NFETs 50 and 52 are connected in series, with the drain to NFET 50 being connected to intermediate node 40 and the source of NFET 52 being connected to ground. A reversal of the series connection of NFETs 50 and 52 is also encompassed by the present invention. One gate of each of NFETs 50 and 52 is connected to intermediate node 42. If desired, evaluate tree 24 may include more than two transistors. In fact, all FETS with source or drain downstream of node 40 will typically have one of their gates tied to node 42, and all FETS with source or drain downstream of node 42 will typically have one of their gates tied to node 40. However, this connection scheme is by no means a required feature of the invention.

Evaluate tree 26 includes double-gated NFET 54, one gate of which is connected to inverse (aka complement) logical input [not]A, and double-gated NFET 56, one gate of which is connected to inverse logical input [not]B. NFETs 54 and 56 are connected in parallel, with the drains the NFETs being connected to intermediate node 42 and the sources of the NFETs being connected to ground. A reversal of the parallel connection of NFETs 54 and 56 is also encompassed by the present invention. The other gates of NFETs 54 and 56 (i.e., the gates not connected to logical inputs [not]A and [not]B, respectively) are connected to intermediate node 40. If desired, evaluate tree 26 may also include more than two transistors, as described above relative to evaluate tree 24 (given that circuits 24 and 26 are the logical complements of one another). Description of the operation of this and other embodiments of the invention follows description of the circuit elements of all of the embodiments.

Figure 2:
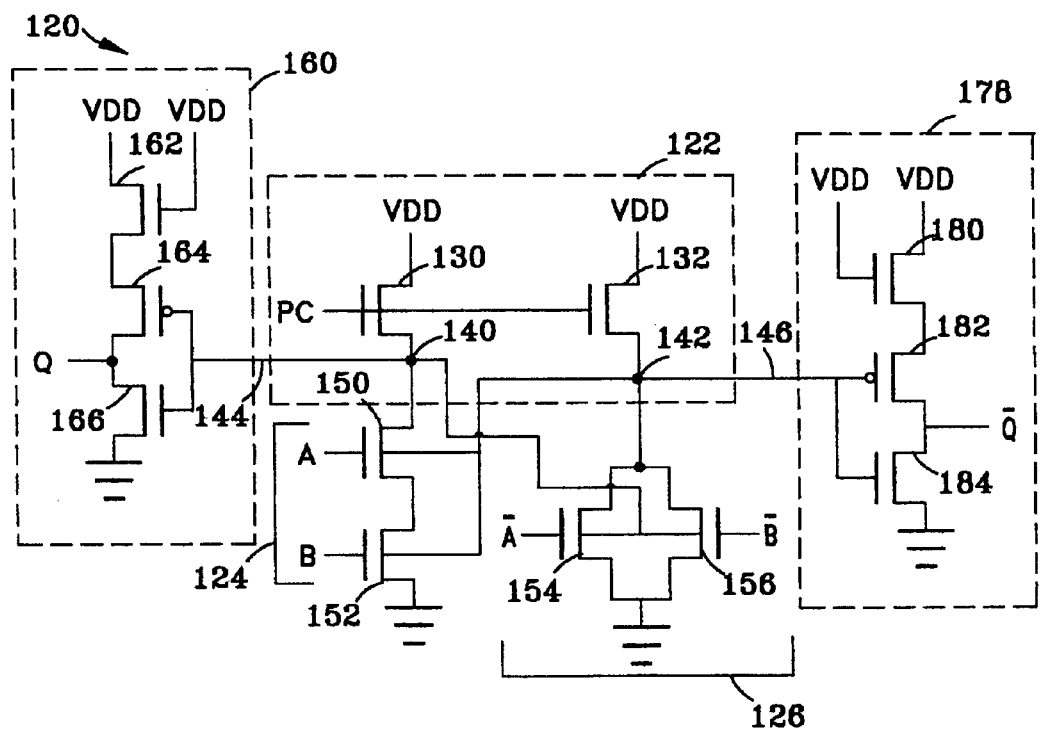
FIG. 2 is a circuit diagram of a dynamic domino logic circuit having body-tied evaluate transistors, with the circuit being designed to operate under conditions where $V_{DD}â0/00¤V_{diode}+V_T$.

Another embodiment of the present invention is the domino differential logic circuit 120 illustrated in FIG. 2. Circuit 120 is a dynamic domino circuit having a differential load structure 122, a first evaluate tree 124 and a second evaluate tree 126. Differential load structure 122 includes a first NFET 130 (all transistors in circuit 120 are single-gated) and a second NFET 132, both connected to $V_{DD}$. The gates of NFETs 130 and 132 are each connected to a precharge clock PC. The source of NFET 130 is connected to intermediate node 140 and the drain of NFET 132 is connected to intermediate node 142. Nodes 140 and 142 are connected via lines 144 and 146, respectively, to level-shifting output buffers 160 and 178, which are described below.

Evaluate tree 124 includes NFET 150, the gate of which is connected to logical input A, and NFET 152, the gate of which is connected to logical input B. NFETs 150 and 152 are connected in series, with the drain of NFET 150 being connected to intermediate node 140 and the source of NFET 152 being connected to ground. A reversal of the series connection of NFETs 150 and 152 is also encompassed by the present invention. The bodies of NFETs 150 and 152 are connected to intermediate node 142. If desired, evaluate tree 124 may include more than two transistors, as discussed above relative to evaluate tree 24.

Evaluate tree 126 includes NFET 154, the gate of which is connected to inverse logical input [not]A, and NFET 156, the gate of which is connected to inverse logical input [not]B. NFETs 154 and 156 are connected in parallel, with the drain of the NFETs being connected to intermediate node 142 and the source of the NFETs being connected to ground. A reversal of the parallel connection of NFETs 154 and 156 is also encompassed by the present invention. The bodies of NFETs 154 and 156 are connected to intermediate node 140. If desired, evaluate tree 126 may include more than two transistors, as discussed above relative to evaluate tree 26.

Level-shifting output buffers 160 and 178 are provided to ensure logical outputs Q and [not]Q provide true values when the circuit is operated in an environment where $V_T<V_{DD}<V_T+V_{diode}$. $V_T$ is the threshold voltage for the NFET and $V_{diode}$ is the voltage at which the P/N junction becomes forward biased. Output buffer 160 includes NFET 162, PFET 164 and NFET 166 connected in this order in series, with the drain of NFET 162 being connected to $V_{DD}$ and the source of NFET 166 being connected to ground. The gate of NFET 162 is also connected to $V_{DD}$ and the gates of PFET 164 and NFET 166 are connected to intermediate node 140. Logical output Q is connected between PFET 164 and NFET 166.

Level-shifting output buffer 178 is identical to buffer 160, except that it includes NFET 180, PFET 182 and NFET 184 connected in series in this order instead of NFET 162, PFET 164 and NFET 166, respectively. Also, [not]Q is connected between PFET 182 and NFET 184.

Figure 3:
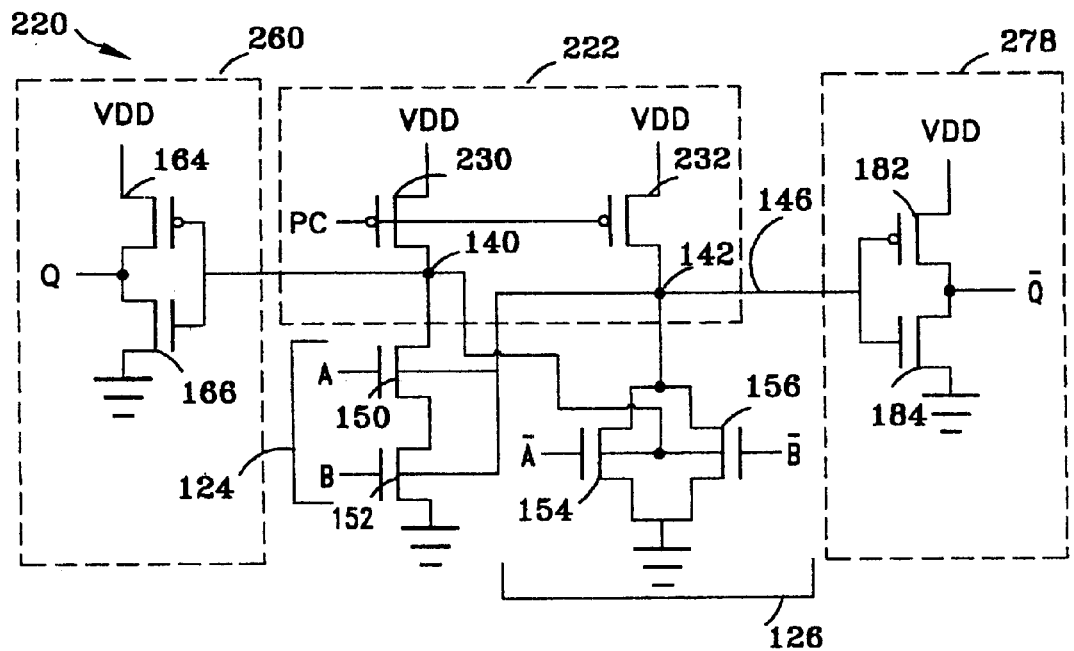
FIG. 3 is a circuit diagram of a dynamic domino logic circuit having body-tied evaluate transistors, with the circuit being designed to operate where $V_{DD}â0/00¤Vdiode$.

Turning next to FIG. 3, another embodiment of the differential logic circuit of the present invention, circuit 220, is illustrated. Circuit 220 is similar to circuit 120, with several exceptions. Differential load structure 222 includes PFETs 230 and 232 in place of NFETs 130 and 132 used in differential load structure 122, respectively. Output buffer 260 lacks NFET 162 used in output buffer 160 and output buffer 278 lacks NFET 180 used in output buffer 178.

Figure 4:
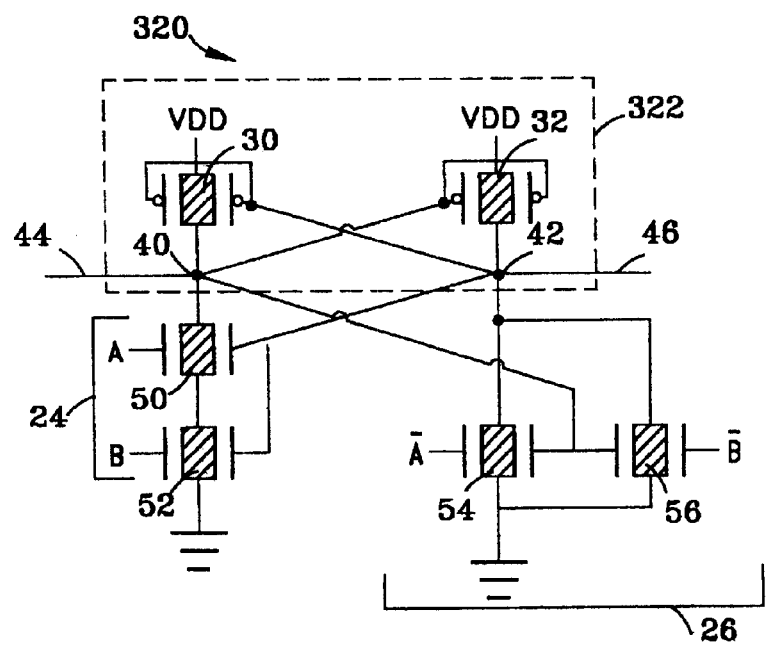
FIG. 4 is a circuit diagram of a static DCVS logic circuit using double-gated transistors.

Referring to FIG. 4, yet another embodiment of the differential logic circuit of the present invention is static DCVS circuit 320. The latter is identical to circuit 20, with the exception of certain details of its differential circuit 322. No precharge clock PC is connected to double-gated PFETs 30 and 32. Instead, the gates of PFET 30 are connected to intermediate node 42, and the gates of PFET 32 are connected to intermediate node 40. As with differential load structure 22, the source of PFET 30 is connected to intermediate node 40 and the source of PFET 32 is connected to intermediate node 42. Nodes 40 and 42, which carry the logical outputs from circuit 320, are also connected to downstream logic and/or other circuitry not forming part of circuit 320 via lines 44 and 46, respectively.

Figure 5:
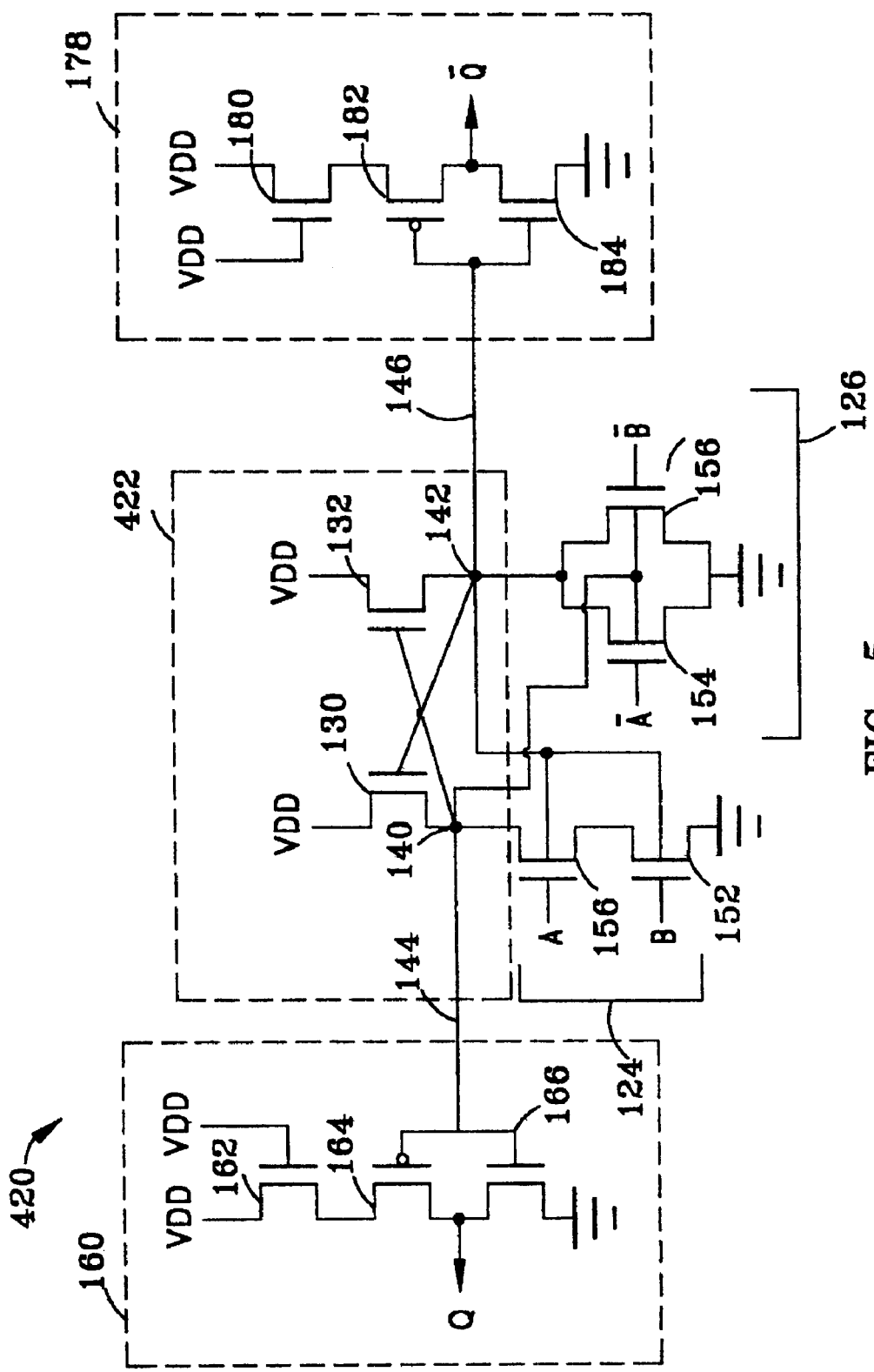
FIG. 5 is a circuit diagram of a static DCVS logic circuit having body-tied evaluate transistors, with the circuit being designed to operate where $V_{DD}â0/00¤V_{diode}+V_T$.

Another static DCVS embodiment of the present invention, circuit 420, is illustrated in FIG. 5. Circuit 420 is identical to circuit 120 shown in FIG. 2, with the exception that differential load structure 422 is used in place of structure 122. In load structure 422, no precharge clock PC is connected to NFETs 130 and 132, and the gate of NFET 130 is connected to intermediate node 142, and the gate of NFET 132 is connected to intermediate node 140. Nodes 140 and 142 are also connected to output buffers 160 and 178, respectively, via respective lines 144 and 146.

Figure 6:
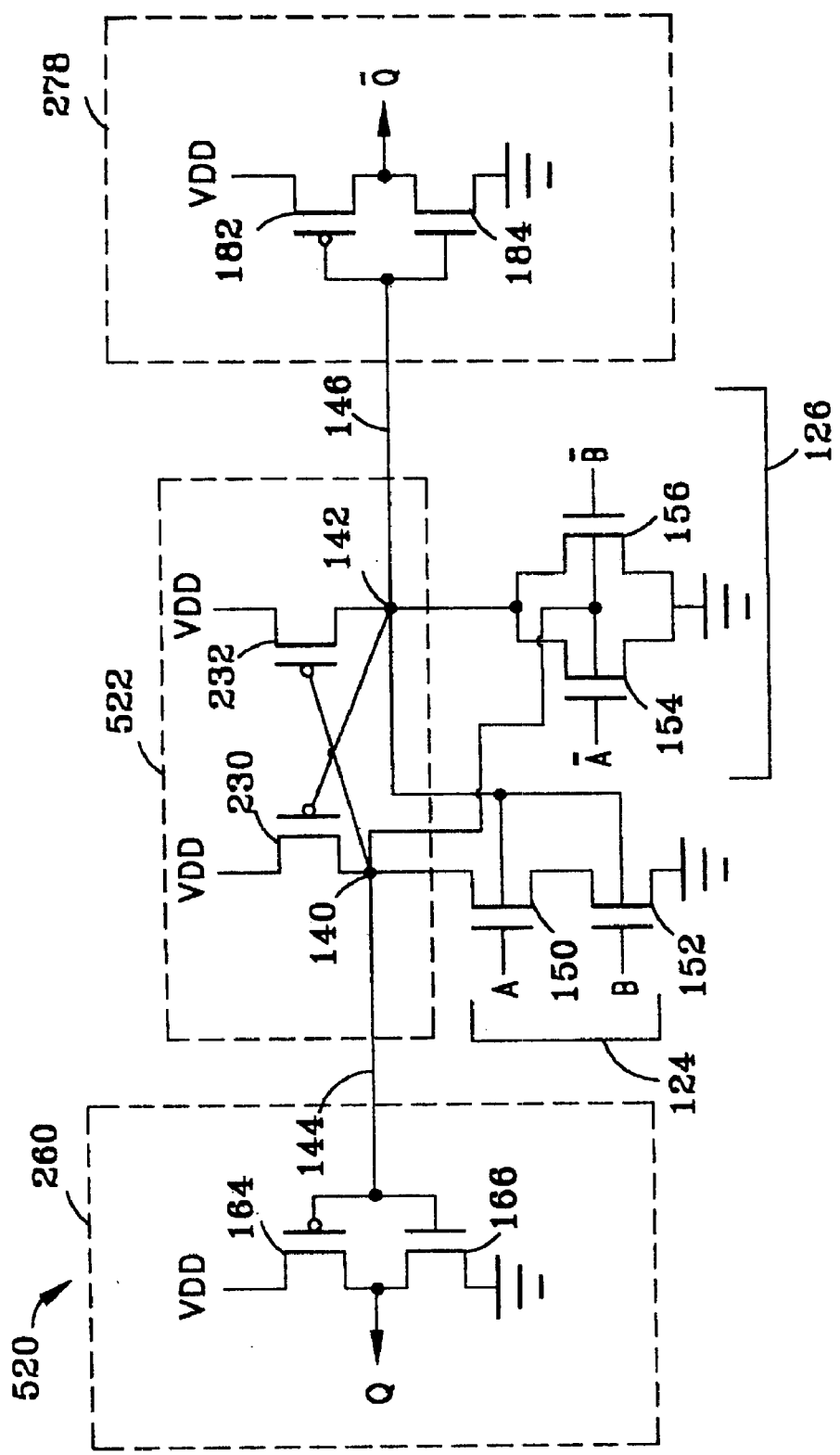
FIG. 6 is a circuit diagram of a static DCVS logic circuit having body-tied evaluate transistors, with the circuit being designed to operate where $V_{DD}â0/00¤V_{diode}$.

FIG. 6 illustrates yet another static DCVS circuit, identified as circuit 520, which is identical to circuit 220 shown in FIG. 3, except that differential load structure 522 is used in place of differential load structure 222. In load structure 522, no precharge clock PC is connected to PFETs 230 and 232 and the gate of PFET 230 is connected to intermediate node 142 and the gate of PFET 232 is connected to intermediate node 140.

Operation of the various embodiments of the present invention will now be discussed. With reference to FIG. 1, operation of circuit 20 is initiated by the transition of clock PC to ground. Precharge clock PC is provided to one of the two gates of each of PFET 30 and 32 so as to turn on the PFETs, thereby charging the capacitance of intermediate nodes 40 and 42 to voltage $V_{DD}$.

In the next phase, the evaluate mode, PFETs 30 and 32 are turned off as clock PC goes high. This allows nodes 40 and 42 to initially float, while circuit 20 awaits logical inputs A and B for evaluate tree 24 and inverse logical inputs [not]A and [not]B for evaluate tree 26. Assuming A and B go high, then NFETs 50 and 52 are turned on, thereby connecting intermediate node 40 with ground. Intermediate node 42 remains high, as the inverse (i.e., low) signals on [not]A and [not]B do not turn on NFETs 54 and 56. Because node 40 has been driven to ground, by connecting this node to the gates of NFETs 54 and 56 these transistors are driven off. This ensures the signal at node 42 remains high. Thus, at the end of this evaluate cycle, a low logical output is provided via line 44 as a consequence of its connection to node 40, and a high logical output is provided via line 46 as a consequence of its connection to node 42. The reverse operation would occur if the inputs to NFETs 50 and 52 were initially low and the inputs to NFETs 54 and 56 were initially high, resulting in a high output on line 44 and a low output on line 46. Such reverse operation also holds true for the other embodiments of the invention, the operation of which is described below, and so discussion of such reverse operation is omitted in the interest of avoiding unneeded repetition.

Considering next circuit 120, illustrated in FIG. 2, operation commences during a precharge phase with the application of a precharge clock PC to NFETs 130 and 132, which turns on the NFETs. This drives nodes 140 and 142 high to voltage $VDD-V_T$ (as a result of the threshold drop through NFETs 130 and 132). By providing the signal level $V_{DD}-V_T$ to nodes 140 and 142, the bodies of NFFTs 150, 152, 154, and 156 are raised, lowering their effective threshold voltages and preconditioning evaluate circuits 124 and 126 prior to logic evaluation for high speed at any given $V_{DD}$. Assuming in the evaluate phase inputs A and B are high, then NFETs 150 and 152 are turned on and node 140 is connected to ground. By providing the ground signal at node 140 to the bodies of NFETs 154 and 156, which are receiving low inputs [not]A aid [not]B, the threshold at which these transistors turn on is raised thriller, thereby ensuring node 142 remains high, by reducing the parasitic D.C. leakage through NFEfs 154 and 156. Similarly, by connecting the high signal at node 142 with the bodies of NFETs 150 and 152, the threshold at which these transistors turn on is lowered so as to ensure the transistor drive current is maximized.

Level-shifting output buffers 160 and 178 in logic circuit 120 are provided for situations where the dynamic differential load structures of the present invention having single-gated transistors, will be operated in an environment where $V_{DD}$ â0/00¤$V_T+V_{diode}$. Such operating conditions exist when operation at low power is desired, yet a conventional supply power is used. Continuing the operational assumption above, when inputs A and B are high and intermediate node 140 is grounded, then PFET 164 is turned on. NFET 162 is also turned on because $V_{DD}$ is provided to its gate, but NFET 166 is turned off due to the low signal provided to its gate. Accordingly, $V_{DD}-V_T$ is provided at Q due to the $V_T$ drop across NFET 162. Output buffer 178 functions similarly. The outputs of Q and [not]Q are reduced in voltage by $V_{DD}-V_T$ to reduce voltage swing, and hence save power, and to ensure PFET 164 can be completely turned off. Although output buffers 160 and 178 invert the signal at nodes 140 and 142, respectively, this is easily accommodated in downstream logic, as the true and complement versions of the signal are needed downstream anyway.

Turning now to circuit 220 illustrated in FIG. 3, this circuit is intended to be operated in the condition where $V_{DD}$â0/00¤$V_{diode}$. These operating conditions are present when lower power consumption is desired and reduced performance is acceptable. The operation of circuit 220 is quite similar to that of circuit 120, except that because PFETs 230 and 232 are used in differential load structure 222, during the precharge phase clock PC transitions to ground. This clock signal turns on the PFETs, which in turn causes $V_{DD}$ to be present at nodes 140 and 142. Assuming in the evaluate phase inputs A and B are high, then node 140 is connected to ground and node 142 is driven high. These low/high states at nodes 140 and 142, respectively, are reinforced by the body tie connections of nodes 142 and 140 to evaluate tree 124 and 126, respectively, as discussed above.

Concerning output buffers 260 and 278, because logic circuit 220 is intended to be operated where $V_{DD}$â0/00¤$V_{diode}$, rather than $V_{DD}$â0/00¤$V_T+V_{diode}$ as is the case with circuit 120, NFETs 162 and 180 of output buffers 160 and 178 are not required. Because PFETS 230 and 232 are used in place of NFETs 130 and 132, $V_{DD}$ must already be reduced to avoid forward biasing the body-source junction diode. This lower $V_{DD}$ is provided based on the intended operating environment for circuit 220, i.e., low power and low power supply. As a result, there is no need to reduce the voltage at Q and [not]Q by one $V_T$.

The operation of circuit 320 illustrated in FIG. 4 differs somewhat from the other circuit having double-gated transistors, circuit 20 illustrated in FIG. 1. Assuming that inputs A and B arrive as high signals, then node 40 is driven low. This low signal is connected to the gates of PFET 32, thereby turning on the PFET. Because NFETs 54 and 56 remain off due to the low inputs [not]A and [not]B they receive, node 42 is driven high to $V_{DD}$. Because node 42 is connected to each of the two gates of NFETs 50 and 52, these are driven on. Similarly, because node 40 is connected to each of the two gates of NFETs 54 and 56, both gates of these transistors are turned off. Also, because node 42 remains high and is connected to a gate of PFET 30, additional current is provided, thereby ensuring node 40 remains connected to ground.

Turning next to FIG. 5, circuit 420 is designed for use in an environment where $V_{DD}$â0/00¤$V_T+V_{diode}$. The operation of circuit 420 is similar to, but in some ways is the reverse of, the operation of circuit 320. Because double-gated transistors are not used, output buffers 160 and 178 are connected to nodes 140 and 142, respectively. The operation of these circuits is described above relative to circuit 120. Also, because NFETs 130 and 132 are used in place of PFETs 30 and 32, the low voltage at node 140 (assuming inputs A and B arrive high) turns off NFET 132 due to the connection of its gate with node 140. The high voltage at node 142 turns on NFET 130, thereby connecting node 140 with ground.

The embodiment of the invention illustrated in FIG. 6 is designed for use in an environment where $V_{DD}$â0/00¤$V_{diode}$. The operation of circuit 520 is similar to that of circuit 320, except that output buffers 260 and 278 are connected to nodes 140 and 142, respectively. Operation of output buffers 260 and 278 is discussed above relative to circuit 220.

The present invention provides benefits when employed in a wide variety of differential DCVS or domino circuit logic due to its ability to change the $V_{diode}$ thresholds of the transistors so as to reduce sub-threshold leakage currents. By changing threshold, one can exaggerate the $I_{on}/I_{off}$ ratio of the device, i.e., by moving its body potential. Changing transistor body bias accomplishes this by changing the base potential out of which the gate field must move the channel. This enhances signal stability and fidelity of logical output.

The present invention is particularly advantageous when used in connection with SOI NFETs and PFETs. The possibility of current leakage across the N/P diode at source/body and drain/body interfaces due to the floating nature of such bodies is reduced significantly by delivering a signal to the bodies of the NFETs and PFETs that biases them in the desired direction.

While the present invention has been described in connection with specified embodiments, it will be understood that it is not so limited. On the contrary, it is intended to cover all alternatives, modifications and equivalents as may be included within the spirit and scope of the invention as defined in the appended claims.

What is claimed is:

1. A logic circuit comprising:
   plurality of evaluate transistors, each leaving a body; and
   a differential load structure connected to each of said bodies;
   wherein said differential load structure includes first and second transistors, each having an input and an output, further wherein said plurality of evaluate transistors includes a plurality of transistors in a first evaluate tree, each having an input, and a plurality of transistors in a second evaluate tree, each having an input, the logic circuit tither including a first level-shifting output buffer connected between said output of said first transistor and said input of a transistor in said first evaluate tree and a second level-shifting output buffer connected between said output of said second transistor and said input of a transistor in said second evaluate tree.

2. A logic circuit according to claim 1, wherein the logic circuit further includes a precharge clock for providing a precharge clock signal, said precharge clock connected to said first and second transistors.

3. A logic circuit according to claim 1, wherein transistors in said first evaluate tree are connected in series and transistors in said second evaluate tree are connected in parallel.

4. A logic circuit according to claim 1, wherein said plurality of evaluate transistors and said first and second transistors are silicon-on-insulator transistors.

5. A logic circuit according to claim 1, wherein said level-shifting output buffer includes a plurality of transistors that reduce $V_{DD}$ by at least one $V_T$.

6. A method of enhancing stability of a differential logic circuit, comprising the steps of:
   providing a differential logic circuit having a plurality of transistors arranged in a first evaluate tree and a second evaluate tree, each transistor having one of a single gate with a body and double gate, and
   a differential load structure having a first intermediate output node and a second intermediate output node; and
   biasing, in said first evaluate tree, said body of said each transistor when said each transistor has a single gate and said at least one of said double gates of said each transistor when said each transistor has a double gate with voltage present at said second intermediate node, and biasing, in said second evaluate tree, said body of said each transistor when said each transistor has a single gate and said at least one of said double gates of said each transistor when said each transistor has a double gate with voltage present at said first intermediate node.

7. A method according to claim 6, wherein said biasing step involves biasing said bodies and said at least one of said double gates with a voltage $V_{DD}-V_T$.

8. A method according to claim 6, wherein said biasing step involves biasing said bodies and said at least one of said double gates with a voltage $V_{DD}$.

9. A method according to claim 6, further including the step of biasing signals at said first and second intermediate nodes so as to provide first and second logical outputs that are at $V_{DD}-V_T$.

10. A method according to claim 6, further including the step of biasing signals at said first and second intermediate nodes so as to provide first and second logical outputs that are at $V_{DD}$.

11. A logic circuit, comprising:
    a plurality of evaluate transistors, each laving first and second gates; and
    a differential load structure connected to said first gates of said plurality of transistors;
    wherein said plurality of evaluate transistors includes a plurality of transistors in a first evaluate tree for receiving a logical input and a plurality of transistors in a second evaluate tree for receiving a complement of said logical input; and said differential load structure includes first and second transistors, each providing an output, wherein said output of said first transistor is connected to said first gates of said transistors in said second evaluate tree and said output of said second transistor is connected to said first gates of said transistors in said first evaluate tree.

12. A logic circuit according to claim 11, wherein the logic circuit further includes a precharge clock connected to said first and second transistors for providing a precharge clock signal to said first and second transistors.

13. A logic circuit according to claim 4, wherein:
    said first and second transistors each have first and second gates; and
    said output of said first transistor is connected to said first gate of said second transistor and said output of said second transistor is connected to said first gate said first transistor.

14. A logic circuit according to claim 11, wherein said plurality of evaluate transistors are NFETs and said differential circuit includes a plurality of PFET transistors.

15. A logic circuit according to claim 14, wherein said NFET and PFET transistors are silicon-on-insulator transistors.

16. A logic circuit according to claim 11, wherein transistors in said first evaluate tree are connected in series and transistors in said second evaluate tree are connected in parallel.

17. A logic circuit according to claim 11, wherein said plurality of evaluate transistors and said first and second transistors are silicon-on-insulator transistors.

18. A method of enhancing stability of a differential logic circuit, comprising the steps of:
    providing a differential logic circuit having a plurality of transistors arranged in a first evaluate tree and a second evaluate tree, each transistor having a double gate, and a differential load structure having a first intermediate output node and a second intermediate output node; and biasing, in said first evaluate tree, at least one of said double gates of said each transistor with voltage present at said second intermediate node, and biasing, in said second evaluate tree, at least one of said double gates of said each transistor with voltage present at said first intermediate node.

19. A method according to claim 18, wherein said biasing step involves biasing at least one of said double gates with a voltage $V_{DD}-V_T$.

20. A method according to claim 18, wherein said biasing step involves biasing at least one of said double gates with a voltage $V_{DD}$.

21. A method according to claim 18, further including the step of biasing signals at said first and second intermediate nodes so as to provide first and second logical outputs that are at $V_{DD}-v_T$.

22. A method according to claim 18, further including the step of biasing signals at first and second intermediate nodes so as to provide first and second logical outputs that are $V_{DD}$.

* * * * *